(12) United States Patent
Moushon

(10) Patent No.: US 6,861,857 B2
(45) Date of Patent: Mar. 1, 2005

(54) APPARATUS AND METHOD FOR POSITIONING AN INTEGRATED CIRCUIT FOR TEST

(76) Inventor: Gaylan W. Moushon, 566 Ronda Ct., Calimesa, CA (US) 92320

( * ) Notice: Subject to any disclaimer, the term of this patent is extended or adjusted under 35 U.S.C. 154(b) by 0 days.

(21) Appl. No.: 10/274,433

(22) Filed: Oct. 17, 2002

(65) Prior Publication Data

US 2003/0169062 A1 Sep. 11, 2003

Related U.S. Application Data

(60) Provisional application No. 60/330,280, filed on Oct. 17, 2001.

(51) Int. Cl.[7] .......................... G01R 31/02; G01R 31/26
(52) U.S. Cl. ........................................ 324/755; 324/765
(58) Field of Search ................................. 324/754, 755, 324/757, 758, 765

(56) References Cited

U.S. PATENT DOCUMENTS

| | | | | |
|---|---|---|---|---|
| 5,340,011 A | * | 8/1994 | Sanchez | 228/4.5 |
| 5,557,212 A | * | 9/1996 | Isaac et al. | 324/755 |
| 6,064,214 A | * | 5/2000 | Self | 324/754 |

* cited by examiner

*Primary Examiner*—David Zarneke
*Assistant Examiner*—Russell M. Kobert
(74) *Attorney, Agent, or Firm*—Steven J. Adamson

(57) ABSTRACT

An apparatus and method for positioning an integrated circuit (IC) for test in a test assembly. An IC positioning mechanism is provided that permits ready resetting of the position of the device that mounts an IC onto a test socket, thereby permitting efficient modification of a test assembly to accept different sized ICs. A mechanism for preventing inadvertent opening of the test assembly is also disclosed.

17 Claims, 4 Drawing Sheets

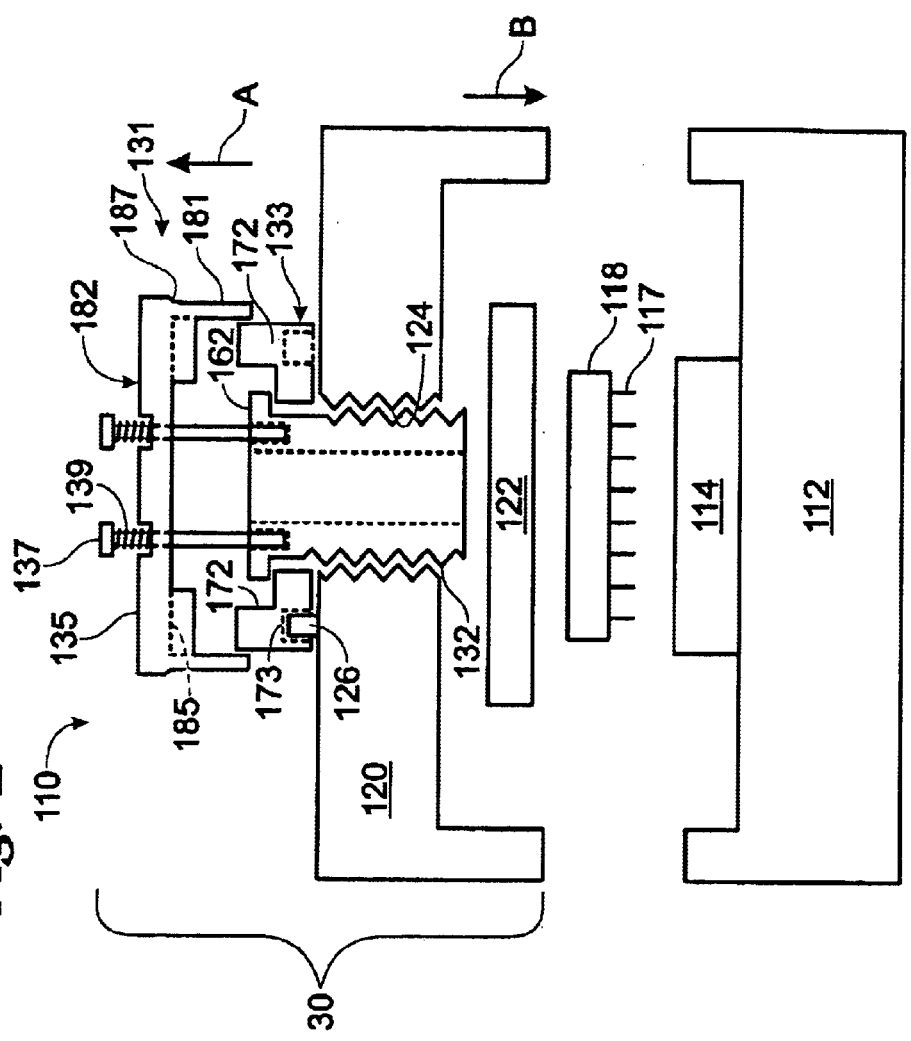
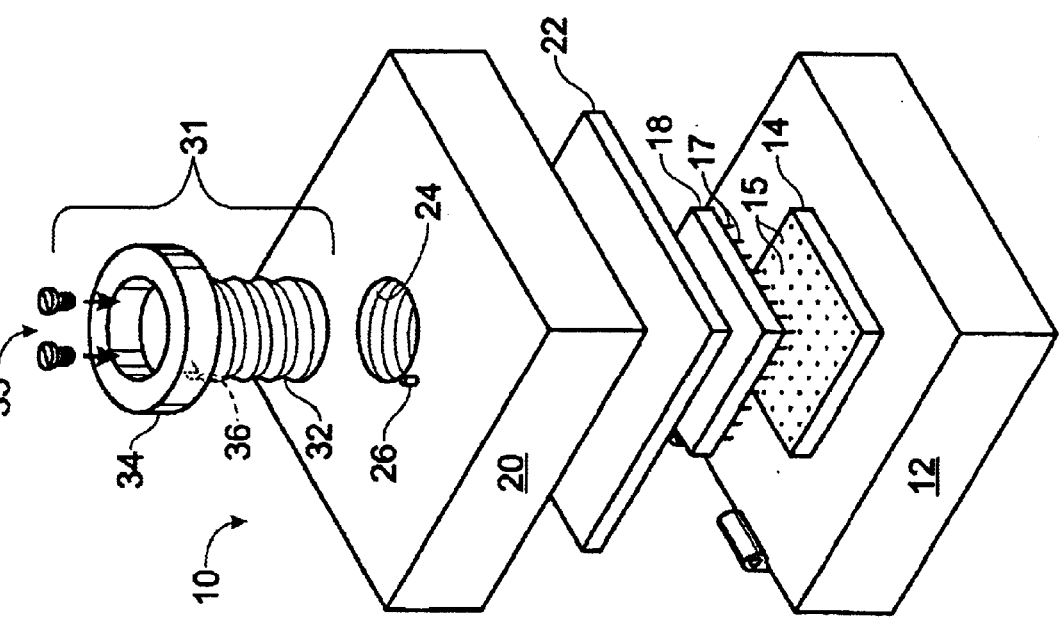

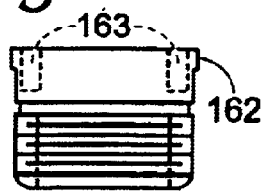
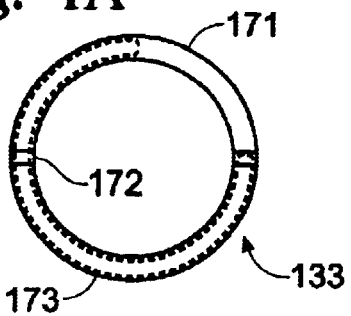
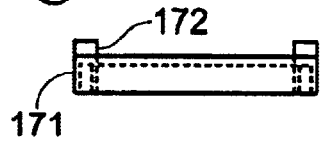
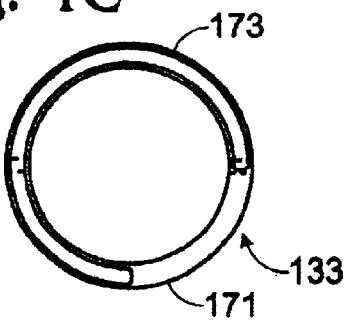
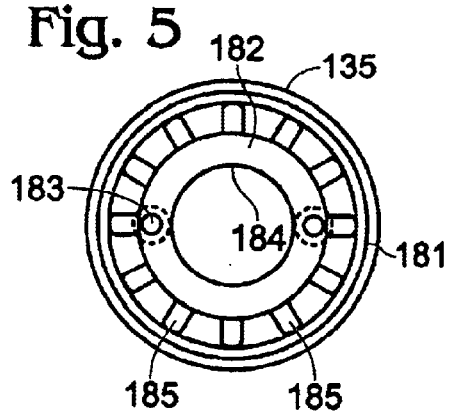
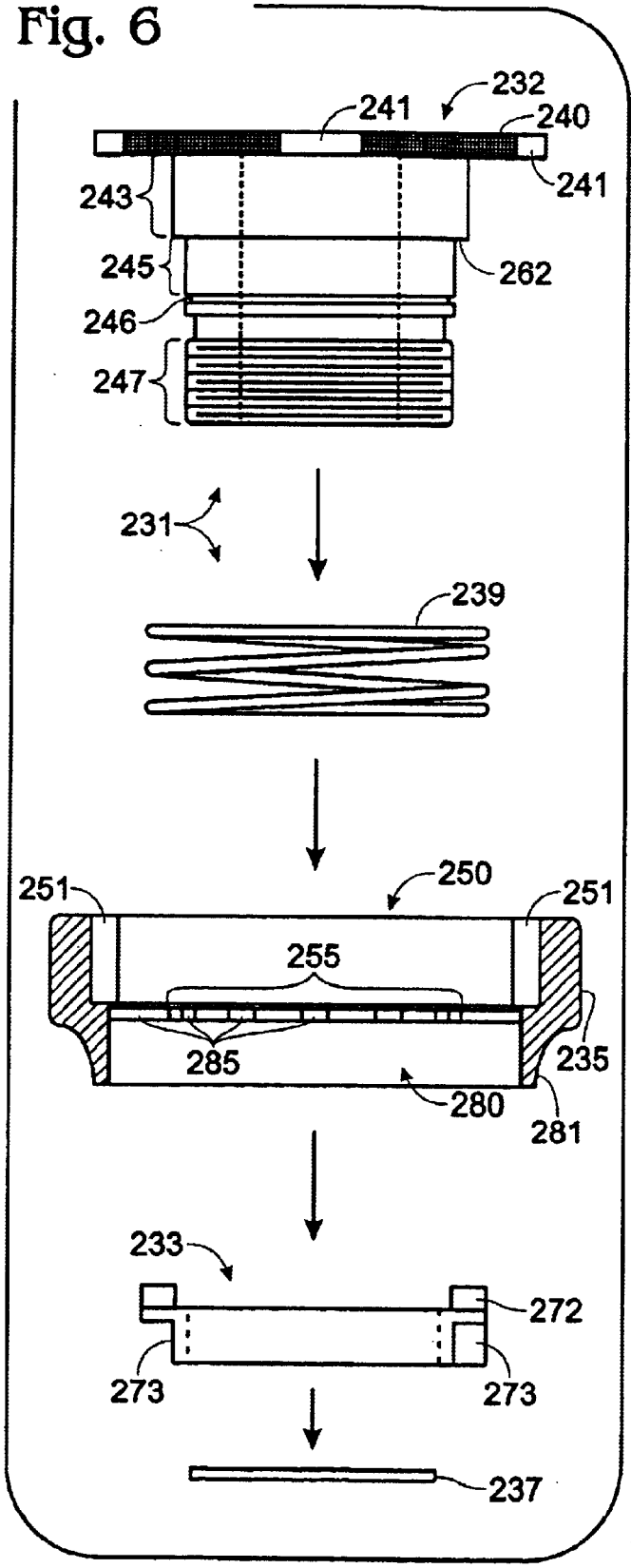

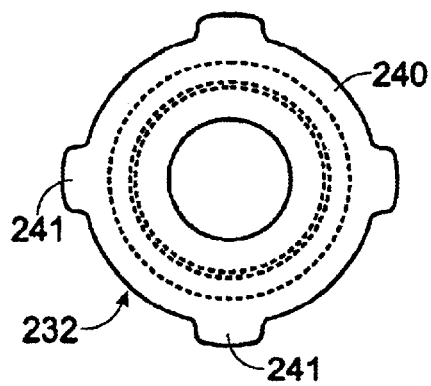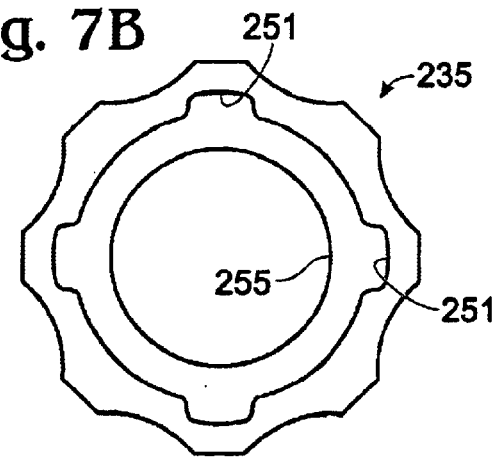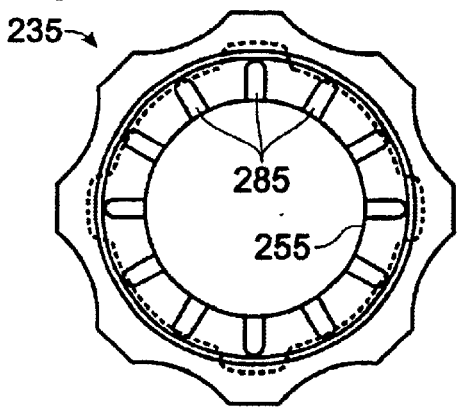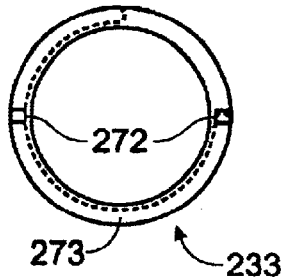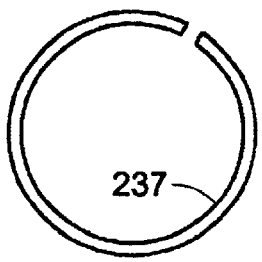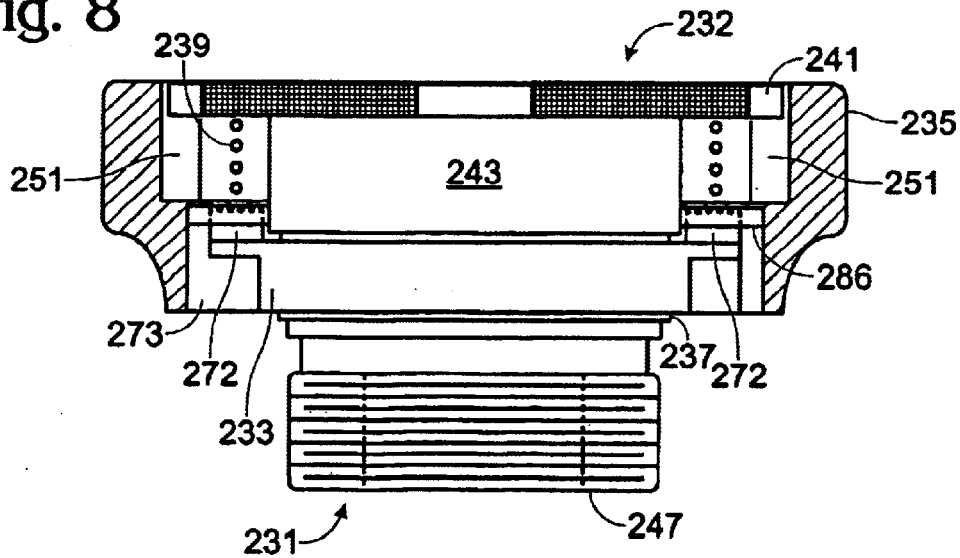

APPARATUS AND METHOD FOR POSITIONING AN INTEGRATED CIRCUIT FOR TEST

CROSS REFERENCE TO RELATED APPLICATIONS

This application claims the benefit of U.S. Provisional Application No. 60/330,280, filed Oct. 17, 2001, entitled Apparatus and Method of Setting IC Mounting Mechanism in Test Equipment and having the same inventor(s) as above.

FIELD OF THE INVENTION

The present invention relates to integrated circuit (IC) test equipment and, more specifically, to securely, rapidly and safely positioning an IC under test in that test equipment.

BACKGROUND OF THE INVENTION

There has been a prolific growth in the production of ICs and an increase in the number and type of products that incorporate ICs. Some ICs, such as memory chips and some processors, are made in such large quantities that they are sometimes regarded as commodity items.

ICs typically consist of a semiconductor substrate or die that is mounted in a package. The package is often a plastic and/or ceramic casing that distributes the densely arranged contact pads of the die to an array of pins or other extensions that extend from the package and permits the IC to be mounted to a printed circuit board or other substrate. Note that while lead or pin packages are referred to predominantly herein, the present invention applies as well to ball grid array, beam lead, flip-chip mounting and other IC mounting techniques.

Typical development of an IC includes the steps of design, fabrication, prototype testing, redesign (modification based on test results), prototype re-testing and larger scale manufacture. It is critically important at all stages of the IC development and production chain, i.e., prototype development through quality assurance, to provide rapid and accurate testing of an IC.

FIG. 1 illustrates a representative prior art testing assembly for testing packaged ICs. The testing assembly 10 includes a base 12 having a test socket 14 and a lid 20 having an IC mounting mechanism 30. In the perspective of FIG. 1, socket 14 is shown as extending above base 12 so that it may be seen, though it is typically recessed below the top surface of base 12.

In use, an IC 18 is positioned over socket 14 such that pins 17 align with corresponding holes 15 in the socket. The hinged lid 20 is shut and the IC mounting mechanism is actuated to assert a distributed force onto the IC that pushes the pins of the IC a sufficient distance into holes 15. The IC mounting mechanism includes a screw-based positioning mechanism 31 that determines the distance by which the pins are seated into the holes and a pressure plate 22 that more evenly distributes the force of the positioning mechanism.

The positioning mechanism includes a cylindrical screw 32, an annular disk 34 and coupling screws 35. These components engage a threaded hole 24 in lid 20 and a stop pin 26 mounted on the top of lid 20. The cylindrical screw 32 threads into hole 24 and the annular disk has a ¾ rotation length recessed groove 36 on its underside that fits over pin 26. The relative position of the annular disk and the cylindrical screw are set by screws 35 with the cylindrical screw threaded into hole 24 and the annular disk mounted such that groove 36 is positioned about pin 26. The relative position of the cylindrical screw and the annular disk is maintained by the coupling screws 35. To seat an IC into socket 14, the annular disk is turned ¾ rotation (the length of groove 36) which pushes the pressure plate down an appropriate distance to securely seat the IC on the socket in a manner that does not damage pins 17 or other aspects of the chip, package or test equipment.

To establish the appropriate depth of cylindrical screw 32 below lid 20, it is necessary to connect these two components at a first relative position, mount an IC in test assembly 10 and run an IC test program to confirm whether all of the pins 15 are properly contacted. If the pins are not properly contacted, then coupling screws 35 are unscrewed, the relative position of the annular disk and cylindrical screw is repositioned, screws 35 are re-tightened, the lid is closed, the annular disk is turn ¾ rotation to mount the IC onto the socket, and the IC pin seating test program is run again. This multiple step setting procedure is repeated until the annular ring and cylindrical screws are positioned to appropriately seat an IC each time.

This positioning, screwing, testing, repositioning, etc., procedure is undesirably time consuming and adds significantly to the cost of prototype assessment and IC production. The disadvantageous aspects of this multiple-step test setup procedure are compounded by the fact that different ICs have different sized packages and the multiple-step test setup procedure must necessarily be repeated for each type of IC under test.

A need thus exists for more efficiently and economically accommodating different sized ICs and IC packages in IC test equipment.

Another relevant aspect of the present invention is providing a security mechanism that prevents a test operator from inadvertently opening a test assembly, i.e., opening the assembly before releasing the pressure asserted by the IC mounting mechanism. Opening the lid before rotating the mounting mechanism back ¾ rotation (or the like) can cause the lid to fly open with significant force, potentially causing damage to the operator or equipment. Furthermore and perhaps more importantly, if the positioning mechanism is not repositioned upward before mounting, then as the lid is pivoted closed, the portion of the pressure plate closest to the hinge will contact the IC first and force the IC onto the socket at an angle, as opposed to a uniform force from above. Mounting an IC at an angle is far more likely to cause pin damage and mis-alignment.

SUMMARY OF THE INVENTION

Accordingly, it is an object of the present invention to provide an IC test assembly that permits ready adjustment of the IC positioning mechanism.

It is another object of the present invention to provide an IC test assembly that does not utilize fixed fastener-based adjustment of the IC positioning mechanism, as discussed above in the prior art embodiments.

It is another object of the present invention to provide an IC test assembly that permits bias-release based adjustment of the IC positioning mechanism.

It is also an object of the present invention to provide a security mechanism for an IC test assembly that prevents both inadvertent opening of the assembly and opening prior to withdraw of the IC mounting force.

These and related objects of the present invention are achieved by use of an apparatus and method for positioning an integrated circuit for test as described herein.

The attainment of the foregoing and related advantages and features of the invention should be more readily apparent to those skilled in the art, after review of the following more detailed description of the invention taken together with the drawings.

BRIEF DESCRIPTION OF THE DRAWINGS

FIG. 1 is a perspective view of a representative prior art testing assembly for testing packaged ICs.

FIG. 2 is a partial cross-sectional view of an IC test assembly incorporating an IC positioning mechanism in accordance with the present invention.

FIGS. 3–5 illustrate components of the IC positioning mechanism of FIG. 2 in accordance with the present invention.

FIG. 6 is an exploded view of another embodiment of an IC positioning mechanism in accordance with the present invention.

FIGS. 7A–7E illustrate components of the IC positioning mechanism of FIG. 6 in accordance with the present invention.

FIGS. 8 and 9 illustrate the embodiment of FIG. 6 in the engaged and unengaged positions.

DETAILED DESCRIPTION

Figure 9:
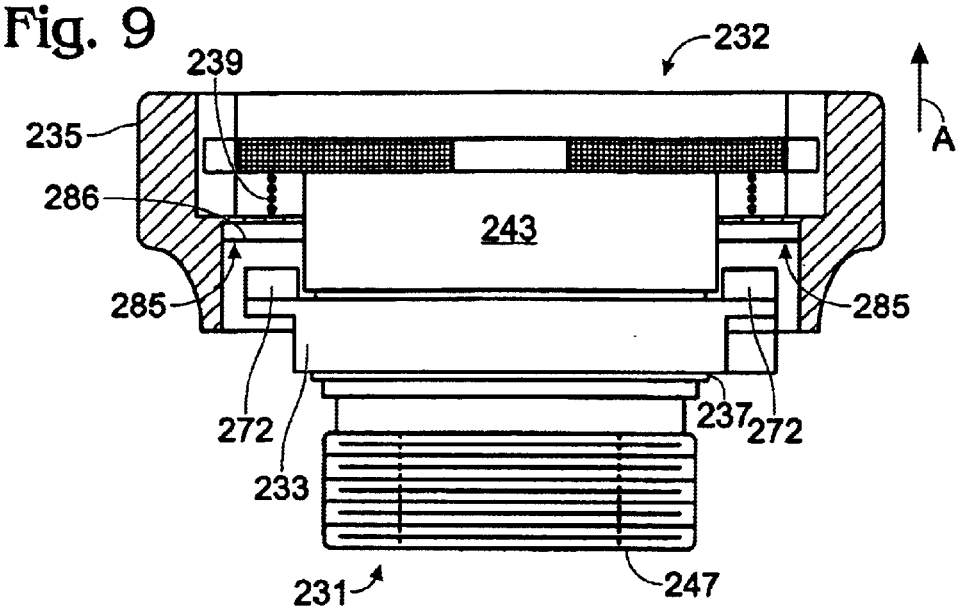

Referring to FIG. 2, a partial cross-sectional view of an IC test assembly 110 having an IC mounting mechanism 130 that incorporates a screw-based IC positioning mechanism 131 in accordance with the present invention is shown. The arrangement of FIG. 2 illustrates some of the same components illustrated in FIG. 1. These include the base 112, socket 114, pins 117, IC 118, pressure plate 122, lid 120, threaded hole 124 and stop pin 126.

IC positioning mechanism 131 includes a positioning screw 132, an annular ring 133, a positioning handle member 135, fastening mechanism 137 and a biasing device 139. In this particular embodiment, the fastening members are screws and the biasing devices 139 are coil springs. It should be recognized that other suitable fastening and biasing techniques may be employed without departing from the present invention. FIGS. 3–5 illustrate the positioning screw, annular ring and handle member, respectively, in more detail.

FIG. 3 is a cross-sectional view of positioning screw 132. FIG. 3 illustrates that positioning screw 132 includes an annular ring region 145, a threaded region 147, a flange 162 and receiving holes 163 for receiving screws 137.

FIGS. 4A–4C are a top, cross-sectional and bottom view, respectively, of annular ring 133. FIGS. 4A–4C illustrate that annular ring 133 has a ring body 171 which has one or more protrusions 172 rising from a top surface thereof and a stop pin receiving groove 173 having a preferred length of approximately ¾ of the ring's circumference formed in the bottom surface of the ring.

FIG. 5 illustrates a bottom view (from the perspective of FIG. 2) of handle member 135. Illustrated in FIGS. 2 and 5, handle member 135 includes walls 181 that extend from a relatively planar top portion 182. Top portion 182 is preferably machined to have holes 183 that accommodate screws 137. These holes are preferably countersunk on the top surface to accommodate spring 139 as shown in FIG. 2.

The top portion also includes a central bore opening 184 and a plurality of radially disposed recesses 185 into which the protrusion(s) 172 of the annular ring are inserted. The device of FIG. 2 is said to be engaged when protrusions 172 are seated in recesses 185 and unengaged or disengaged when handle member 135 is lifted to remove protrusions 172 from the recesses. The disengaged position is shown in FIG. 2. (Note that FIG. 8 shows an engaged position). The recesses 185 are provided in a circumferentially shelf 186.

Test assembly 110 and IC positioning mechanism 131 are preferably arranged and function as follows. Positioning screw 132 is preferably a hollow cylinder (to permit air passage through its interior shaft) and flange 162 extends past the screw threads so as to engage the top surface of the annular ring 133. The annular ring is positioned such that groove 173 is mounted over stop pin 126, and flange 162 maintains annular ring 133 and groove 173 over stop pin 162.

Handle member 135 is fastened by screws 137 to the top of positioning screw 132. As a result, movement of handle member 135 necessarily moves positioning screw 132. Springs 139 bias the handle member onto the annular ring such that protrustions 172 are positioned into and maintained by recesses 185. Note that FIG. 2 illustrates the position of the handle member when lifted off of the annular ring, i.e., lifted upward in the direction of arrow A, compressing the springs and lifting the handle member out of engagement with protrusions 172 (the unengaged position).

Turning the handle member when protrusions 172 are lodged in recesses 185 causes the annular ring to move within the ¾ rotation distance allotted by groove 173. Since the handle member is securely coupled to the positioning screw, movement of the handle member through this ¾ rotation results in a corresponding movement of the positioning screw. Accordingly, rotation of the handle member in the downward direction causes the positioning screw to move downward relative to lid 20 and push IC 118 onto socket 114 via pressure plate 122.

If the positioning screw is not far enough down relative to lid 120 to adequately mount an IC (or if it is too far down), handle member 135 is lifted in the direction of arrow A such that protrusions 172 are no longer engaged in recesses 185. The handle member can then be turned in a manner that does not turn the annular ring, but does turn the positioning screw a corresponding amount and inherently repositions the positioning screw. When the desired amount of repositioning is achieved, handle member 135 is released and reseated onto the annular ring such that protrusions 172 are inserted into recesses 185. The handle member can then be turned in a manner that turns the annular ring and the positioning screw through the guarded ¾ rotation mounting movement.

To make fine adjustments, the handle member is simply lifted, turned slightly and set back down. This arrangement eliminates the repetitive and tedious multi-step test setup procedure of the prior art.

Suitable materials for the components discussed herein include plastics, metals and other suitable materials as generally known in the art.

Referring to FIG. 6, an exploded view of an alternative embodiment of a mechanism for positioning an IC for test in accordance with the present invention is shown. FIGS. 7A–7E illustrate further details of the components shown in FIG. 6. IC Positioning mechanism 231 includes a positioning screw 232, a bias spring 239, a handle member 235, an annular ring 233 and a fastening or "snap" ring 237.

Screw 231 includes a complementary flange 240 (complementary to the shape of top depression 250 in handle member 235, see below), a spring region 243, an annular ring region 245, snap ring groove 246 and thread region 247. Handle member 235 includes a top depression 250, a bottom depression 280, a central opening 255 and recesses 285 that engage the protrusion 272 of annular ring 233. The annular ring also includes a groove or groove like structure 273 for receiving stop pin 126 (of FIG. 2).

In use, positioning screw 232 is inserted through spring 239 and central opening 255 such that the spring and complementary flange are seated in top depression 250 of handle member 235; spring 239 generally located at spring region 243 and spring region 243 being of sufficiently narrow diameter to fit through central opening 255. Annular ring 233 is then slipped over threaded region 247 of the positioning screw into place at annular ring region 245 and seated within the bottom depression 280 of the handle member. Fastening ring 237 is then snapped into groove 246 to maintain each of the above-described items in their respective positions. Positioning screw 232 is then screwed into threaded hole 124 in lid 120 until stop pin 126 is received in groove 273 and stops further rotation. IC positioning mechanism 231 operates in the same manner described for IC positioning mechanism 131 of FIGS. 2–5.

The positioning mechanism 231 of FIGS. 6–7 is both similar and different from the positioning mechanism 131 of FIGS. 2–5. Similarities include, but are not limited to, the following. Complementary flange 240 shares the geometry of top depression 250. Particularly, tabs 241 of flange 240 protrude into recesses 251 of the top depression (and fastening ring 237 holds screw 232 such that flange 240 cannot move above depression 250) so that movement of the handle member necessarily results in movement of the positioning screw. Thus, positioning screw 232 and handle member 235 are linked, similar to the arrangement of FIG. 2 that utilized screws 137 to fasten the positioning screw and handle member. Furthermore, positioning mechanism 131 of FIG. 2 and positioning mechanism 231 of FIG. 6 both operate by lifting the handle member against a bias force to disengage the handle member from the annular ring protrusions. An operator can then turn the handle member to set the positioning screw at a desired depth, then release the handle member such that recesses 285 re-engage the annular ring protrusions, thereby limited positioning screw movement to the ¾ rotation provided by the annular ring groove 273. Another commonality is that flange 262, between the spring region and the annular ring region, contacts the annular ring as does flange 162. This is illustrated in more detail in FIGS. 8 and 9.

Differences, however, include that the locking relationship of the positioning screw and the handle member is not achieved with fasteners, but rather complementary, locking geometry and a snap ring that holds them in place. Among other beneficial aspects, this arrangement induces less friction during lifting or "disengagement" of the handle member, thus promoting increased ease-of-use and longer life. With respect to annular ring 270, the groove of ring 131 has been replaced with an exterior ¾ circumferential recess that together with the interior of wall 281 functions as a "groove" that receives stop pin 126.

Referring to FIGS. 8–9, partial cross-sectional views of IC positioning mechanism 231 in the engaged and unengaged positions in accordance with the present invention are respectively shown. Threaded region 247 is threaded a sufficient distance into hole 124 (FIG. 2) that stop pin 126 seats itself in groove 273 (FIG. 8). Spring 239 is disposed about spring region 243 and biases handle member 235 onto annular ring 233. The screw, handle member and annular ring are held in the position illustrated in FIG. 8 by virtue of the bias force of spring 239 and the resistance of fastening ring 237.

In FIG. 8, protrusions 272 are seated in recesses 285 formed in shelf 286. Thus, rotation of handle member 235 moves annular ring 233 and screw 232 (via the geometry of tabs 241 and recesses 251). In the engaged position, the screw is limited to the amount of rotation (¾ in the present scenario) permitted by groove 273. It should be recognized that while not specifically shown, the engaged position of IC mechanism 131 of FIG. 2 operates in the same manner.

In FIG. 9, handle member 235 has been lifted in the direction of arrow A such that spring 239 is compressed and recesses 285 are lifted off of protrusions 272 (the annular ring staying down under the force of gravity). Handle member 235 can then be turned freely, moving screw 232 to a desired position relative to lid 120 and threaded hole 124. The handle member can then be set back down such that the protrusions re-engage the recesses and the IC positioning mechanism is again constrained to the IC mounting movement, i.e., the guarded ¾ circumference rotation (or the like) defined by groove 273. In a preferred embodiment, the threads for the positioning screw and the location of recesses on the underside of handle member 135,235 are configured to achieve a movement of positioning screw 132,232 relative to lid 120 of 0.005" with each adjacent recess.

Figure 10:
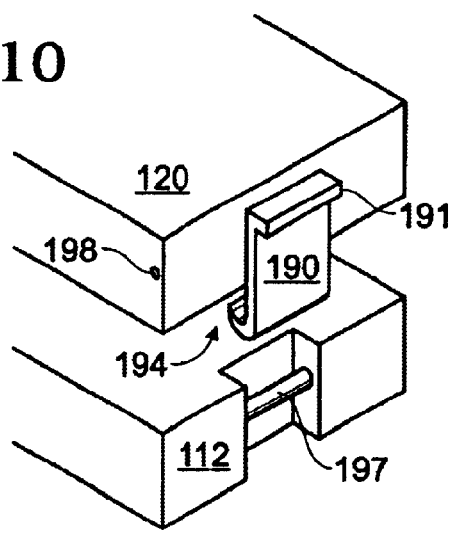
FIGS. 10–12 illustrate a security mechanism for preventing inadvertent opening of an IC test assembly in accordance with the present invention.
Figure 11:
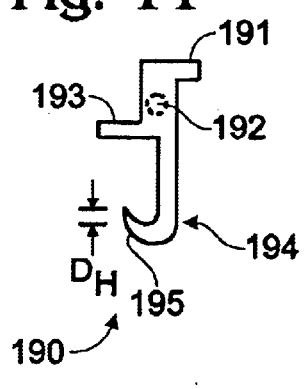
Figure 12:
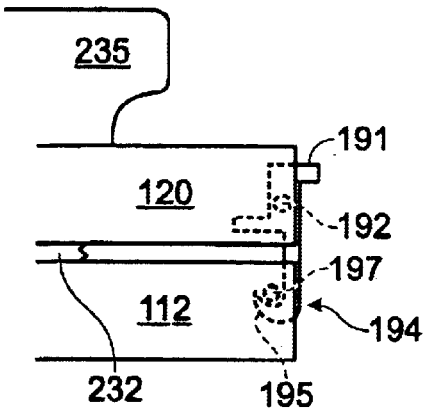

Referring to FIGS. 10–12, a security mechanism for preventing inadvertent opening of the test assembly in accordance with the present invention is shown. Latch 190 is provided with a J-hook 194 that hooks around roll pin 197. FIG. 10 is a perspective view with lid 120 partially raised. As the lid is lowered, stopping ledge 193 prevents latch 190 from swinging in too far such that the latch becomes positioned on the inside of roll bar 197. Surface 195 is angle so that when the latch contacts the roll bar, the J-hook is pushed backward to swing via gravity back under the roll bar when the J-hook clears the bar in downward movement. Tab 191 extends from the front of the latch above pivot point hole. Depression of tab 192 causes the J-hook to swing out and clear of the roll bar for opening the assembly. Pivot rod 198 in lid 120 is preferably provided in a machined hole through lid 120 and pivot hole 192.

FIG. 12 illustrates the test assembly in use. When handle member 235 is rotated to mount an IC into a test socket (via positioning screw 232 and pressure plate 122), the maximum gap between the lid 120 and base 112, in one embodiment, is 0.040". The depth of the hook, $D_H$, in this exemplary embodiment is 0.035". Thus, with pressure being exerted by the IC positioning mechanism, the latch cannot be moved enough to clear the roll pin. To open the device, the handle member has to be rotated in the direction opposite of mounting to release the tension on the lid. The lid may move into contact with the base, lessening the 0.040" gap to zero such that the J-hook has 0.005" clearance from which to be pivoted out and clear of roll pin 197 to "unlock" the lid. In this or like manner, inadvertent opening of the lid is prevented. In addition, the IC positioning mechanism is necessarily reset before the next IC mounting operation.

While the invention has been described in connection with specific embodiments thereof, it will be understood that it is capable of further modification, and this application is intended to cover any variations, uses, or adaptations of the invention following, in general, the principles of the invention and including such departures from the present disclosure as come within known or customary practice in the art to which the invention pertains and as may be applied to the essential features hereinbefore set forth, and as fall within the scope of the invention and the limits of the appended claims.

What is claimed is:

1. An integrated circuit (IC) testing apparatus, comprising:
   a first housing member having a socket for receiving an IC under test and a second housing member having an IC positioning mechanism, said IC positioning mechanism including;
   an IC positioning member configured for movement relative to said second housing member in such a manner as to seat an IC in said socket; and
   a handle member coupled to said positioning member and configured for operation in an engaged position that provides a first range of relative movement of said IC positioning member and an unengaged position that provides a second range of relative movement of said IC positioning member, said first range being less than said second range;
   wherein said handle member is biased into one of said engaged and unengaged positions and application of a sufficient force against said bias moves said handle member to the other or said engaged and unengaged positions.

2. The apparatus of claim 1, wherein said IC positioning member includes a threaded section and movement of said IC positioning member relative to said second housing member is achieved by rotation of said threaded section.

3. The apparatus of claim 1, further comprising a mechanism coupled to said IC positioning member and said handle member that defines said first range of relative movement.

4. The apparatus of claim 1, wherein said first range of relative movement includes an IC mounted position and an IC unmounted position, and said apparatus further comprises a latch mechanism that releasably couples said first housing member to said second housing member, said latch mechanism being configured to impede opening of said first and second housing members when said apparatus is in said IC mounted position and to permit opening of said first and second housing members when said apparatus is in said IC unmounted position.

5. The apparatus of claim 1, wherein said positioning member includes a member that applies a primary IC positioning force and a distribution platform coupled to said force applying member that more broadly distributes the positioning force.

6. A die mounting device for mounting a die under test into a desired position, comprising:
   a first housing member and a second housing member;
   a die positioning member configured for movement in a first direction, said die positioning member being coupled to said first housing member and configured to move relative thereto;
   a mechanism coupled to said die positioning member that limits movement or said die positioning member in said first direction to a defined range of movement; and
   an operator control member coupled to said die positioning member that provides operator controlled movement of said positioning member;
   wherein said operator control member and said mechanism that limits movement of said die positioning member are configured for operating in an engaged arrangement and a non-engaged arrangement, wherein in one of said engaged arrangement and said non-engaged arrangement movement of said operator control member in limited to moving said die positioning member within said defined range of movement and in the other said engaged arrangement and said non-engaged arrangement movement of said operator control member is not limited to moving said die positioning member within said defined range of movement.

7. The device of claim 6, wherein movement of said operator control member is limited to moving said die positioning member within said defined range of movement when said device is in said engaged arrangement.

8. The device of claim 7, wherein said operator control member is biased into said engaged arrangement, and application of a force opposing said bias moves said operator control member into said non-engaged arrangement.

9. The device of claim 6, wherein said die positioning member is threaded and wherein rotation of said die positioning member causes movement of said die positioning member in said first direction.

10. The device of claim 6, wherein said second housing member include a socket for receiving a die under test.

11. The device of claim 6, wherein said mechanism that limits movement of said die positioning member includes a first part that is provided with said first housing member and a second part that is releasably coupled to said operator control member, wherein said first and second parts cooperate to establish said defined range of movement.

12. The device of claim 10, wherein said defined range of movement includes a die mounted position and a die unmounted position and wherein said device further comprises a latch mechanism that releasably latches said first housing member with said second housing member, said latch mechanism being configured to impede opening of said housing members when said device is in the die mounted position and to permit opening of said housing members when said device is in the die unmounted position.

13. The device of claim 12, wherein said latch mechanism includes a latch member pivotally coupled to one of said first and second housing members and configured to have a hook shaped section.

14. A die mounting device for mounting a die under test into a desired position, comprising:
   a first housing member;
   a die moving member configured for movement in a first direction, said die moving member being coupled to said housing member and configured to move relative thereto;
   a mechanism couple to said die moving member that limits movement of said die moving member in said first direction to a defined range of movement; and
   a operator control member coupled to said die moving member;
   wherein said operator control member and said mechanism that limits movement of said die moving member in said first direction are configured for operating in an engaged arrangement and a non-engaged arrangement, and wherein at least one of said operator control member and said mechanism that limits movement of said die mounting member in said first direction is moveable between a first position that achieves said engaged arrangement and a second position that achieves said non-engaged arrangement.

15. The device of claim 14, wherein said operator control member is biased into said engaged arrangement, and application of a force opposing said bias moves said operator control member into said non-engaged arrangement.

16. The device of claim 14, wherein said die moving member is threaded and wherein rotation of said die moving member causes movement of said die moving member in said first direction.

17. The device of claim 14, further comprising a second housing member and wherein said defined range of movement includes a die mounted position and a die unmounted position and wherein said device further comprises first and second housing members and a latch mechanism that releasably latches said first and second housing members, said latch mechanism being configured to impede opening of said housing members when said device is in the die mounted position and to permit opening of said housing members when said device is in the die unmounted position.

* * * * *